(12) United States Patent
Burke et al.

(10) Patent No.: US 8,642,425 B2
(45) Date of Patent: Feb. 4, 2014

(54) METHOD OF MAKING AN INSULATED GATE SEMICONDUCTOR DEVICE AND STRUCTURE

(75) Inventors: Peter A. Burke, Portland, OR (US); Eric J. Ameele, Sandy, OR (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 42 days.

(21) Appl. No.: 13/482,920

(22) Filed: May 29, 2012

(65) Prior Publication Data
US 2013/0323921 A1 Dec. 5, 2013

(51) Int. Cl.
*H01L 21/336* (2006.01)

(52) U.S. Cl.
USPC ........... 438/259; 438/197; 438/261; 438/589; 438/702; 438/703

(58) Field of Classification Search
USPC ......... 438/197, 259, 261, 268, 270, 700, 702, 438/703, FOR. 424, 589, FOR. 180, 438/FOR. 363
See application file for complete search history.

(56) References Cited

U.S. PATENT DOCUMENTS

| | | |
|---|---|---|
| 5,973,360 A | 10/1999 | Tihanyi |
| 6,351,018 B1 | 2/2002 | Sapp |
| 6,365,462 B2 | 4/2002 | Baliga |
| 6,861,296 B2 | 3/2005 | Hurst et al. |
| 7,005,351 B2 | 2/2006 | Henninger et al. |
| 7,005,353 B2 | 2/2006 | Kocon et al. |
| 7,122,860 B2 | 10/2006 | Peake et al. |
| 7,229,882 B2 | 6/2007 | Nakamura |
| 7,345,342 B2 | 3/2008 | Challa et al. |
| 7,504,303 B2 | 3/2009 | Yilmaz et al. |
| 7,504,306 B2 | 3/2009 | Sapp et al. |
| 7,652,326 B2 | 1/2010 | Kocon |
| 7,807,536 B2 | 10/2010 | Sreekantham et al. |
| 7,884,004 B2 * | 2/2011 | Bangsaruntip et al. ....... 438/586 |
| 2004/0203200 A1 * | 10/2004 | Williams et al. ............. 438/202 |
| 2005/0215027 A1 * | 9/2005 | Williams et al. ............. 438/424 |
| 2006/0170062 A1 | 8/2006 | Kim et al. |
| 2009/0050959 A1 | 2/2009 | Madson |
| 2010/0187602 A1 | 7/2010 | Woolsey et al. |
| 2013/0023111 A1 * | 1/2013 | Purtell ......................... 438/486 |

OTHER PUBLICATIONS

Cobianu et al., "Electrical Properties of Interlevel Deposited Oxides Related to Polysilicon Preparation", Journal De Physique IV, vol. 3, pp. 467-473, Aug. 1993.

* cited by examiner

*Primary Examiner* — Alexander Sofocleous
*Assistant Examiner* — Joannie A Garcia
(74) *Attorney, Agent, or Firm* — Kevin B. Jackson

(57) ABSTRACT

In one embodiment, a trench shield electrode layer is separated from a trench gate electrode by an inter-electrode dielectric layer. A conformal deposited dielectric layer is formed as part of a gate dielectric structure and further isolates the trench shield electrode from the trench gate electrode. The conformal deposited dielectric layer is formed using an improved high temperature oxide (HTO) low pressure chemical vapor deposition (LPCVD) process.

20 Claims, 11 Drawing Sheets

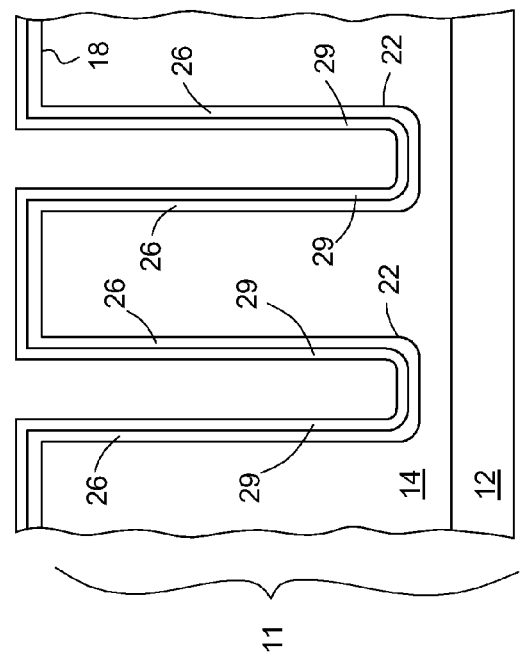
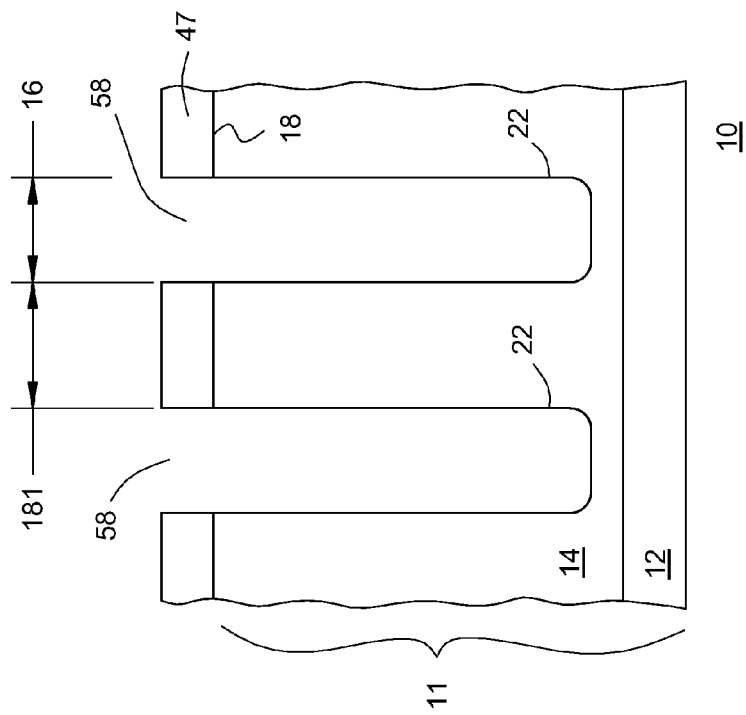
FIG. 2
FIG. 1

METHOD OF MAKING AN INSULATED GATE SEMICONDUCTOR DEVICE AND STRUCTURE

BACKGROUND OF THE INVENTION

This document relates generally to semiconductor devices, and more specifically to methods of forming insulated gate devices and structures.

Metal oxide field effect semiconductor transistor (MOSFET) devices have been used in many power switching applications, such as dc-dc converters. In a typical MOSFET, a gate electrode provides turn-on and turn-off control with the application of an appropriate gate voltage. By way of example, in an n-type enhancement mode MOSFET, turn-on occurs when a conductive n-type inversion layer (i.e., channel region) is formed in a p-type body region in response to the application of a positive gate voltage, which exceeds an inherent threshold voltage. The inversion layer connects n-type source regions to n-type drain regions, and allows for majority carrier conduction between these regions.

There is a class of MOSFET devices in which the gate electrode has been formed in a trench that extends downward from a major surface of a semiconductor material, such as silicon. Current flow in this class of devices has been primarily in a vertical direction through the device, and, as a result, device cells can be more densely packed. All else being equal, the more densely packed device cells can increase the current carrying capability and reduce on-resistance of the device.

The demand for higher current carrying capability has required that the geometries of trench-gated MOSFET devices be reduced. However, as the geometries of trench-gated MOSFET devices shrink (for example, cell pitches less than about 0.9 microns), the quality of gate dielectric films in MOSFET devices has been challenged by the complex topographies created inside the trench structures. For example, forming a quality gate dielectric film on a semiconductor surface with curves and sharp edges adjacent existing thick and thin dielectric layers has been very difficult. Also, in trench-gated MOSFET devices with shield electrode structures, a stacked or layered polysilicon structure has been used with a grown oxide isolating the shield electrode from the gate electrode. Improving the quality of this isolation region without impacting the quality of the gate dielectric film has been a manufacturing challenge. Additionally, embedded nitride films have been considered in some related trench-gated MOSFET devices using shield electrodes structures in an attempt to improve the topography of the films and regions used in the devices. However, such nitride films have been found to trap significant charge under positive gate bias, which has detrimentally impacted the threshold voltage, on-resistance, and/or breakdown voltage of the devices.

Accordingly, it is desirable to have a method and structure that improves the quality of gate dielectric films, improves the quality of the isolation region between gate electrodes and shield electrodes, and that improves the isolation between gate electrodes and other adjacent features.

BRIEF DESCRIPTION OF THE DRAWINGS

FIGS. 1-7 illustrate partial cross-sectional views of a semiconductor device at various stages of fabrication in accordance with an embodiment of the present invention;

Figure 3:
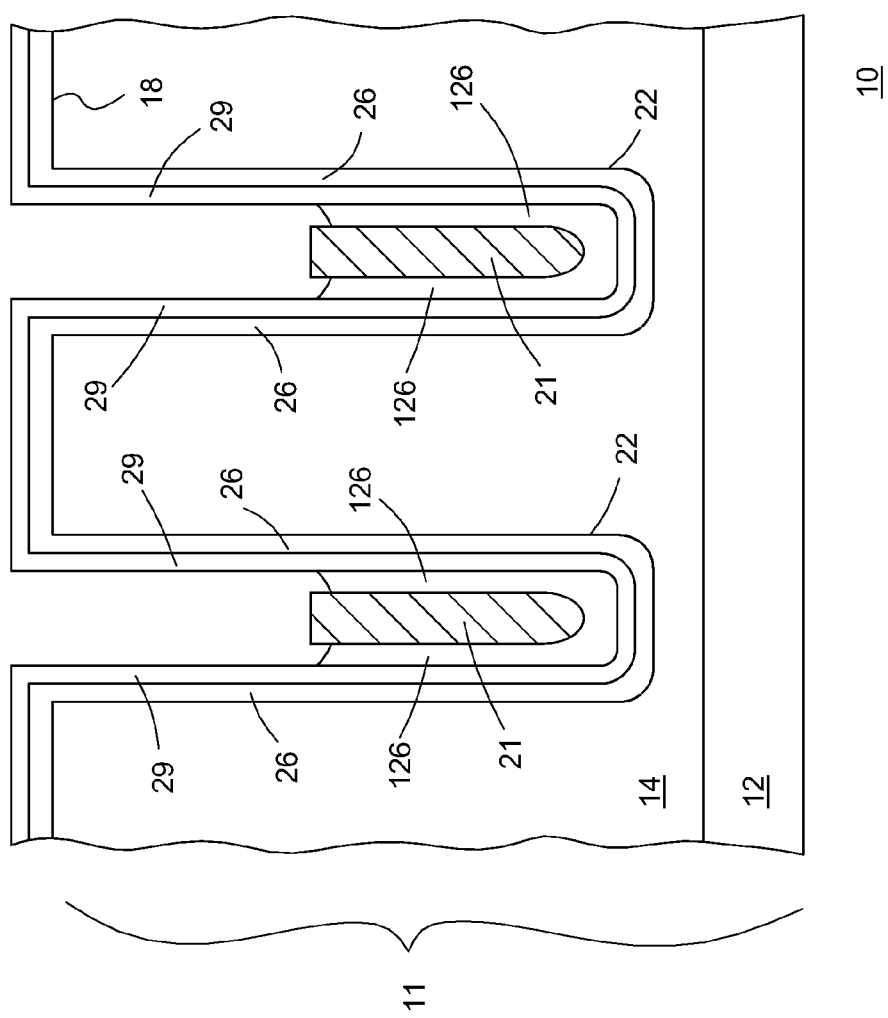

For simplicity and clarity of illustration, elements in the figures are not necessarily drawn to scale, and the same reference numbers in different figures denote generally the same elements. Additionally, descriptions and details of well-known steps and elements may be omitted for simplicity of the description. As used herein current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-channel devices, a person of ordinary skill in the art understands that P-channel devices and complementary devices are also possible in accordance with the present description. For clarity of the drawings, doped regions of device structures are illustrated as having generally straight-line edges and precise angular corners; however, those skilled in the art understand that due to the diffusion and activation of dopants, the edges of doped regions are generally not straight lines and the corners are not precise angles.

Furthermore, the term "major surface" when used in conjunction with a semiconductor region or substrate means the surface of the semiconductor region or substrate that forms an interface with another material, such as a dielectric, an insulator, a conductor, or a polycrystalline semiconductor. The major surface can have a topography that changes in the x, y and z directions.

In addition, structures of the present description may embody either a cellular base design (in which the body regions are a plurality of distinct and separate cellular or stripe regions) or a single base design (in which the body region is a single region formed in an elongated pattern, typically in a serpentine pattern or a central portion with connected appendages). However, one embodiment of the present description will be described as a cellular base design throughout the description for ease of understanding. It should be understood that the present disclosure encompasses both a cellular base design and a single base design.

DETAILED DESCRIPTION OF THE DRAWINGS

FIG. 1 illustrates a partial cross-sectional view of a semiconductor device 10 or cell 10 at an early stage of fabrication in accordance with a first embodiment. Device 10 includes a region of semiconductor material, semiconductor substrate, or semiconductor region 11, which can be, for example, an n-type silicon substrate 12 having a resistivity ranging from about 0.001 ohm-cm to about 0.005 ohm-cm. By way of example, substrate 12 can be doped with phosphorous, arsenic, or antimony. In the embodiment illustrated, substrate 12 provides a drain region, drain contact, or a first current carrying contact for device 10. In this embodiment, device 10 can be configured as a vertical power MOSFET structure, but this description applies as well to insulated gate bipolar transistors (IGBT), MOS-gated thyristors, and other related or equivalent structures as known by one of ordinary skill in the relevant art.

A semiconductor layer, drift region, or extended drain region 14 can be formed in, on, or overlying substrate 12. In one embodiment, semiconductor layer 14 can be formed using semiconductor epitaxial growth techniques. Alternatively, semiconductor layer 14 can be formed using semiconductor doping and diffusion techniques. In an embodiment suitable for a 50 volt device, semiconductor layer 14 can be n-type with a dopant concentration of about $1.0 \times 10^{16}$ atoms/cm$^3$ to about $1.0 \times 10^{17}$ atoms/cm$^3$ and can have a thickness from about 3 microns to about 5 microns. The dopant concentration and thickness of semiconductor layer 14 can be increased or decreased depending on the desired drain-to-source breakdown voltage (BVDSS) rating of device 10. In one embodiment, semiconductor layer 14 can have graded dopant profile. In an alternate embodiment, the conductivity type of substrate 12 can be opposite to the conductivity type of semiconductor layer 14 to form, for example, an IGBT embodiment.

A masking layer 47 can be formed overlying a major surface 18 of region of semiconductor material 11. In one embodiment, masking layer 47 can be a dielectric film or a film resistant to the etch chemistries used to form trenches or trench features described hereinafter. In one embodiment, masking layer 47 can comprise about 0.10 microns to about 0.30 microns of thermal oxide. Openings 58 can then be formed in masking layer 47. In one embodiment, photoresist and etch processes can be used to form openings 58. In one embodiment, openings 58 can have a width 16 of about 0.2 microns to about 0.25 microns. In one embodiment, an initial spacing 181 between openings 58 can be about 0.55 microns to about 0.65 microns.

After openings 58 are formed, segments of semiconductor layer 14 can be removed to form trenches or trench features 22 extending from major surface 18. By way of example, trenches 22 can be etched using plasma etching techniques with a fluorocarbon or fluorine-based chemistry (for example, $SF_6/O_2$). In one embodiment, trenches 22 can extend partially into semiconductor layer 14. In one embodiment, trenches 22 can extend through semiconductor layer 14 and into substrate 12. In one embodiment, trenches 22 can have a depth in a range from about 1.5 microns to about 3 microns. In one embodiment, trenches 22 can be formed in a single etch step absent the use of sidewall spacers as opposed to a multi-step etch process that uses sidewall spacers to define a deeper portion of the trench, which reduces the number of process steps and saves on cost.

FIG. 2 illustrates a partial cross-sectional view of device 10 after additional processing. In an optional step, a sacrificial layer (not shown) is formed adjoining surfaces of trenches 22. By way of example, a thermal silicon oxide layer is grown. Next, the sacrificial layer and all or portions of masking layer 47 can be removed. In accordance with the present embodiment, a layer of material can then be formed overlying surfaces of trenches 22 and major surface 18, which forms gate layer or gate dielectric film 26 in trenches 22. Gate layer or gate layers 26 can be oxides, nitrides, tantalum pentoxide, titanium dioxide, barium strontium titanate, high k dielectric materials, combinations thereof, or other related or equivalent materials as known by one of ordinary skill in the art. In one embodiment, gate layer 26 can comprise silicon oxide and can have a thickness from about 0.01 microns to about 0.05 microns. In one embodiment, gate layer 26 can be silicon oxide formed using a wet oxidation process. In accordance with the present embodiment, gate layer 26 can be formed early in the process, which helps maintain the integrity of the interface between gate layer 26 and semiconductor layer 14, and also provides a more uniform film thickness for gate layer 26. In related devices that form the gate dielectric layer later in the process, the resultant gate layers end up having multiple kinks and uneven portions, which degrades the quality of the gate layer and reliability of the device.

Next, a layer of material 29 can be formed adjacent to gate layer 26. Layer 29 can comprise a material that is different than that of gate layer 26, and in one embodiment, layer 29 can be silicon nitride when gate layer 26 is silicon oxide. In view of the tight dimensions of widths 16 of trenches 22 and in one embodiment, layer 29 can be formed adjoining gate layer 26 without an intervening layer, such as a polysilicon layer. In one embodiment, layer 29 can have a thickness of about 0.01 microns to about 0.03 microns. In one embodiment, a low pressure chemical vapor deposition (LPCVD) silicon nitride process can be used to form layer 29.

Figure 8:
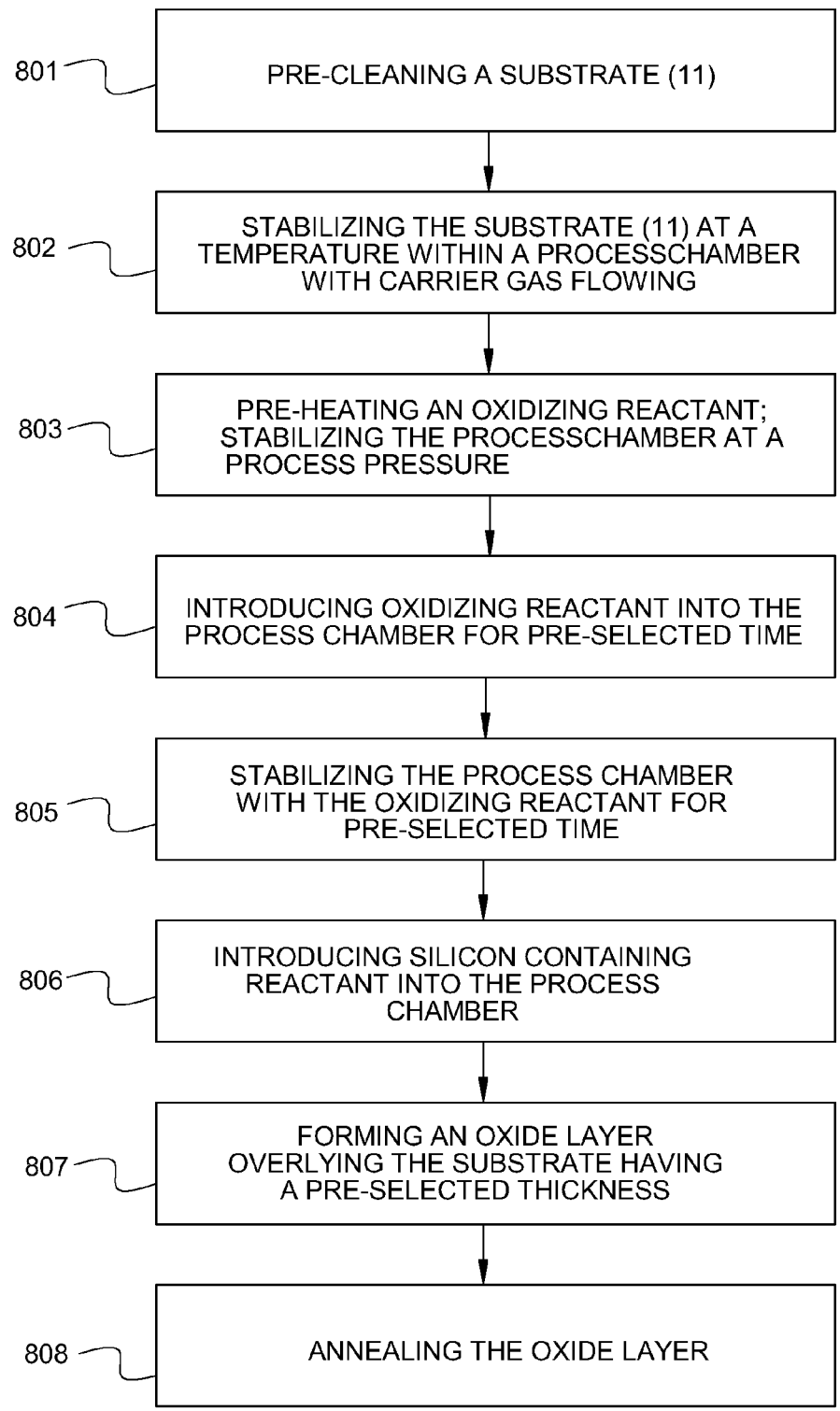
FIG. 8 illustrates a flow diagram for forming a dielectric film in accordance with an embodiment of the present invention.

FIG. 3 illustrates a partial cross-sectional view of device 10 after further processing. A dielectric layer 126 can be formed adjacent layer 29. In one embodiment, dielectric layer 126 can be an oxide. In one embodiment, dielectric layer 126 can be an oxide formed using an LPCVD process with a tetra-ethyl-orthosilicate (TEOS) source material. In one embodiment, dielectric layer 126 can be an oxide layer formed using a LPCVD with a high temperature oxide (HTO) process (LPCVD/HTO), which can form a more dense deposited oxide compared to LPCVD oxides formed using TEOS source materials. In one embodiment, a silane source material can be used with an oxidizing reactant, such as nitrous oxide ($N_2O$) for the LPCVD/HTO process. In one embodiment, dielectric layer 126 can be formed using the improved LPCVD/HTO process described in FIG. 8. In one embodiment, the dielectric layer can have a thickness from about 0.04 microns to about 0.06 microns.

In a subsequent step, a conductive layer is formed adjacent to dielectric layer 126. In one embodiment, the conductive layer can be a metal or a doped crystalline semiconductor layer. In one embodiment, the conductive layer can be polysilicon doped with an n-type dopant, such as phosphorous or arsenic. In one embodiment, the doped polysilicon can be annealed in an inert ambient. Subsequently, the conductive layer can be planarized, and then recessed within trenches 22 to form shield electrodes 21 as illustrated in FIG. 3. In one embodiment, chemical mechanical planarization (CMP) can be used to planarize the conductive layer. In one embodiment, a blanket recess etch step can be used to recess the conductive layer to form shield electrodes 21. In one embodiment, a blanket recess etch can be used to recess and to also etch portions of dielectric layer 126 to recess dielectric layer 126 within trenches 22 as illustrated in FIG. 3. In the blanket recess etch step, layer 29 can act as an etch-stop layer. In another embodiment, a masking layer can be used to selectively etch the layer used to form shield electrodes 21 and layers 126. As an example, a fluorine or chlorine based chemistry can be used for the recess steps.

Figure 4:
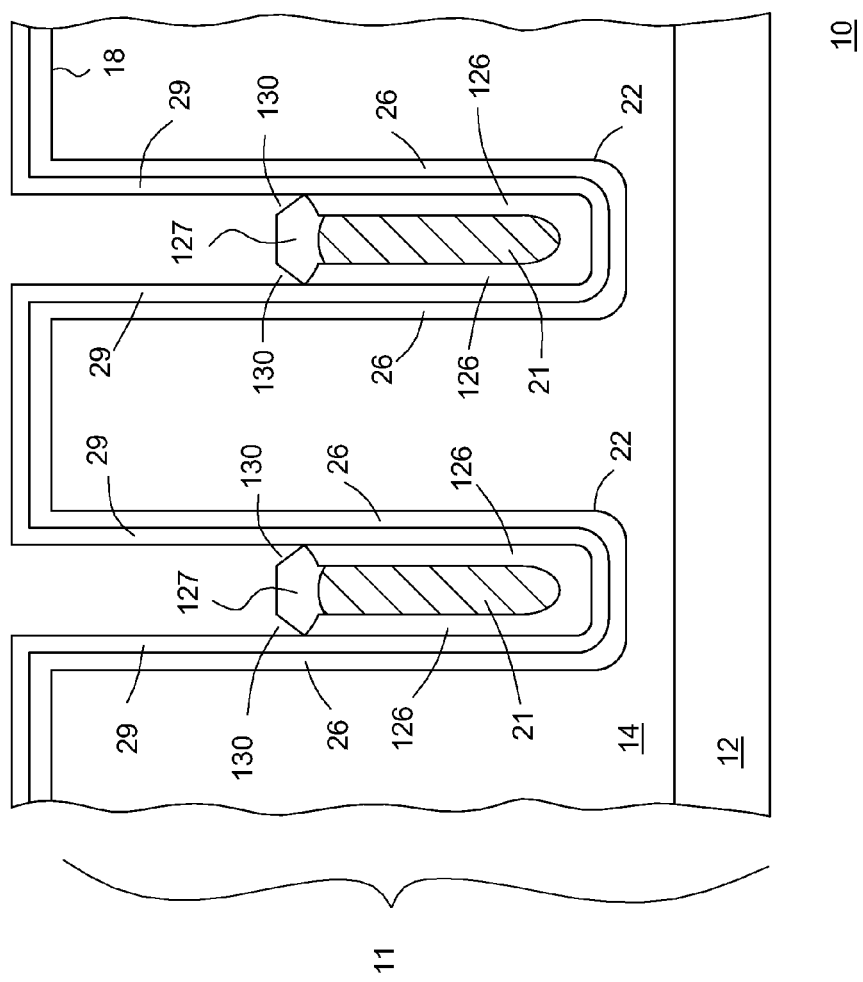

FIG. 4 illustrates a partial cross-sectional view of device 10 after further processing. Layers 127 can be formed overlying upper surfaces of shield electrodes 21. In one embodiment, layers 127 can comprise a dielectric or insulative material, and are configured, for example, as inter-poly dielectric layers or inter-electrode dielectric layers. In one embodiment, layers 127 can comprise a silicon oxide formed using thermal oxidation techniques. In one embodiment, a dry oxidation can be used to form layers 127. In one embodiment, layers 127 can have a thickness from about 0.1 microns to about 0.3 microns.

Figure 5:
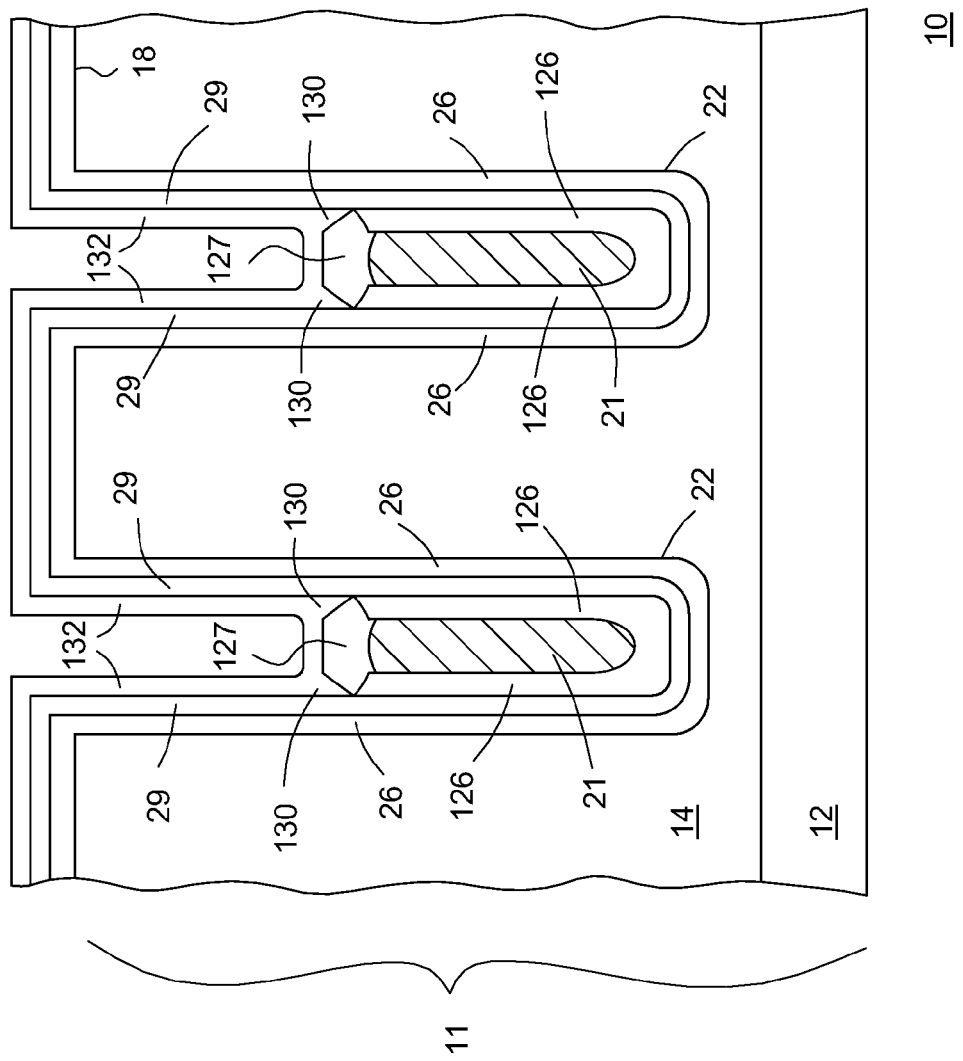

One feature that can result during the formation of layers 127 is the formation of recessed or "fanged" regions 130 between layers 127 and layer 29 as illustrated in FIG. 4. In a subsequent and optional step, a dielectric layer 132 can be formed adjacent layer 29 and within recessed regions 130 as illustrated in FIG. 5. In one embodiment, a deposited oxide can be formed having a thickness in a range from about 0.015 microns to about 0.06 microns. In one embodiment, dielectric layer 132 can be formed using LPCVD techniques with TEOS source material. In one embodiment, dielectric layer 132 can be formed using LPCVD/HTO techniques. In one embodiment, dielectric layer 132 can be formed using the improved LPCVD/HTO process described in FIG. 8.

Figure 6:
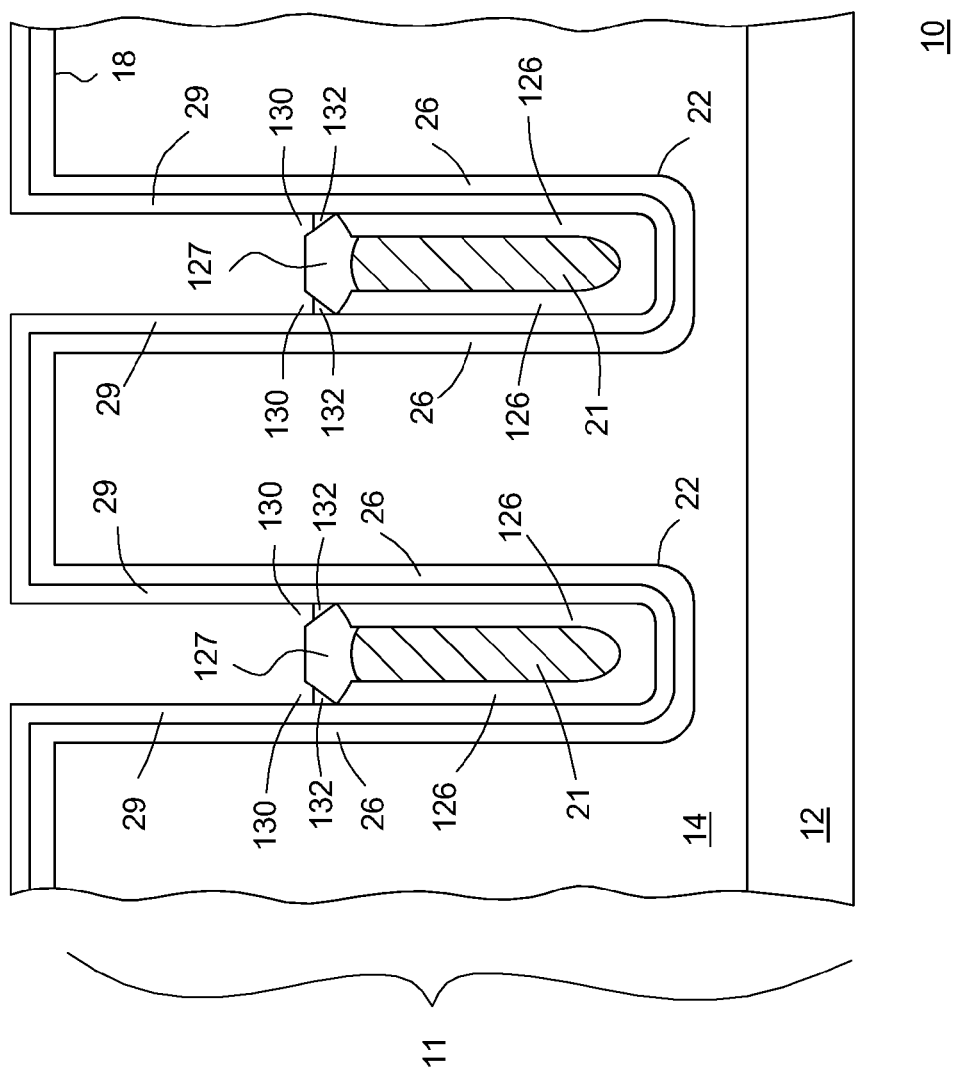

FIG. 6 illustrates a partial cross-sectional view of device 10 after additional processing. In one embodiment, portions of dielectric layer 132 are removed along layer 29 while leaving other portions of dielectric layer 132 within recessed portions 130 to form dielectric regions adjacent layer 127. In one embodiment, a buffered hydrofluoric (HF) wet etch can be used to remove portions of dielectric layer 132. In one embodiment, a cleaning process can be used after the etch step. In one embodiment an SC1 clean can be used. In another embodiment, the formation of dielectric layer 132 can be skipped.

Figure 7:
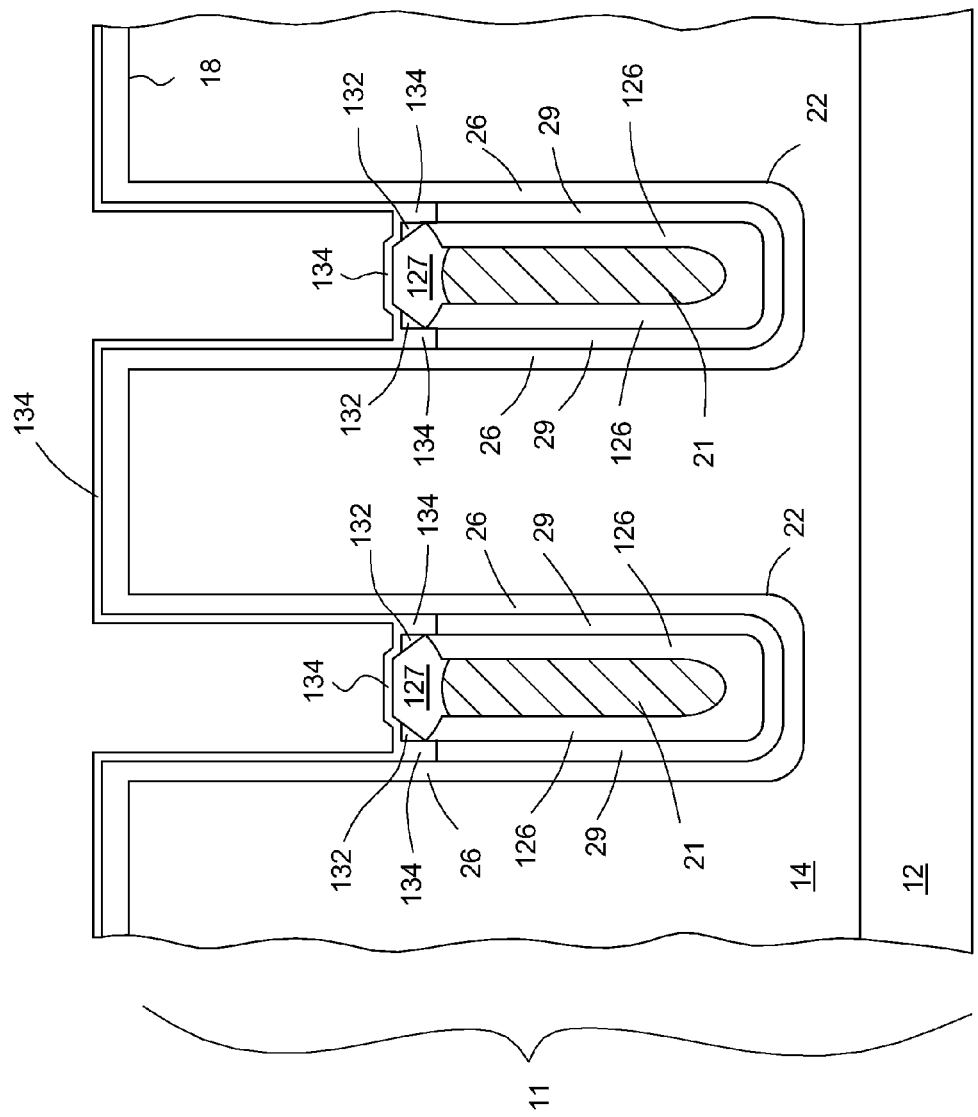

FIG. 7 illustrates a partial cross-sectional view of device 10 after further processing. In a subsequent step, exposed portions of layer 29 can be removed. In accordance with the present embodiment, layer 29 can be recessed below the upper surface of layers 127. In one embodiment, when layer 29 is silicon nitride, a hot phosphoric acid can be used for the removal and recess step. In one embodiment, layer 29 can be recessed from about zero microns to about 0.1 microns below layers 127. In one embodiment, layer 29 can be recessed from about 0.01 microns to about 0.05 microns below layers 127. In a subsequent step, a cleaning process can be used after the etch step to, for example, clean the surface of gate layer 26. In one embodiment, an SC1/SC2 clean can be used.

In a subsequent step and in accordance with the present embodiment, a layer 134 of material can be formed adjacent gate layer 26, within the recessed portions above layer 29, and overlying layers 127 as illustrated in FIG. 7. In one embodiment, layer 134 can be a dielectric material, and is configured to further isolate layer 29 from other structures (for example, gate electrode structures) within device 10 described later. In one embodiment, layer 134 can be an oxide. In one embodiment, layer 134 is configured to add to the overall thickness of the gate dielectric structure for device 10. In one embodiment, the gate dielectric structure includes gate layer 2 and layer 134. In accordance with one embodiment, layer 134 is a silicon oxide formed using an LPCVD/HTO process with modified process conditions as described hereinafter. In one embodiment, layer 134 can have a thickness in a range from about 0.01 microns to about 0.03 microns. In one embodiment where dielectric layer 132 is used, layer 134 can have a thickness in a range from about 0.01 microns to about 0.02 microns. In one embodiment where dielectric layer 132 is not used, layer 134 can have a thickness in a range from about 0.02 microns to about 0.03 microns.

In one embodiment, layer 134 can be formed as a conformal layer having generally uniform thickness over the length of trenches 22 including within the recessed portions of layer 29. In view of the very small dimensions of trenches 22 and the complex topography of the structures (including the recessed portions of layer 29) formed within trenches 22, forming layer 134 in a conformal manner can be difficult. Also, it was found that related LPCVD TEOS deposited oxides had insufficient oxide quality for smaller geometry devices. Additionally, LPCVD/HTO processes using prior process settings were found to be insufficient to form layer 134 in a generally uniform manner. In accordance with one embodiment, an LPCVD/HTO process can be used to form layer 134 as illustrated in accordance with a modified LPCVD/HTO process set forth in the flow diagram of FIG. 8.

In a step 801, substrate 11 can be pre-cleaned to remove any surface, contamination, reduce surface roughness, and/or remove any native oxide that may be present. In one embodiment, an SC1/SC2 pre-clean process can be used. Subsequently, substrate 11 is placed within a process chamber of an LPCVD reactor, and substrate 11 can be stabilized at a temperature from about 750 degrees Celsius to about 850 degrees Celsius as illustrated in step 802. In one embodiment, substrate 11 is stabilized in an inert gas such as, nitrogen. In one embodiment, the inert gas can be turned off once the process chamber is stabilized.

In a step 803, an oxidizing reactant can be pre-heated to a temperature from about 750 degrees Celsius to about 850 degrees Celsius. In one embodiment, the oxidizing reactant can be pre-heated external to the process chamber using an in-line heater adjacent to the gas delivery line. Also, the process chamber can be stabilized at a reduced pressure from about 350 milli-torr to about 600 milli-torr. In one embodiment, the oxidizing reactant can be nitrous oxide ($N_2O$). In one embodiment, the temperature profile within the process chamber can be inverted compared to related LPCVD processes. For example, a higher temperature can be selected at the source gas inlet to break the bonds of the oxidizing reactant to provide an oxygen reactant, and lower temperatures can be selected away from the source gas inlet. In one embodiment, temperatures in the upper zones of the reaction chamber can be similar to those used in related LPCVD processes to maintain thickness control. Also, in accordance with the present embodiment, a higher pressure (for example, 200 milli-torr to about 500 milli-torr) can be used compared to related LPCVD processes to increase surface mobility of the oxygen reactant within the recessed areas of trenches 22 to help improve the deposition in the recessed areas.

In step 804, the oxidizing reactant is introduced into the process chamber for a preselected period of time. In one embodiment, the oxidizing reactant can be turned on and ramped up to 60 standard cubic centimeters per minute (sccm). In one embodiment, the oxidizing reactant can be turned on at a rate of 1 sccm per second and ramped at 1 sccm per second for 60 seconds. In one embodiment, the oxidizing reactant can have a flow rate from about 40 sccm to about 140 sccm. In one embodiment, the oxidizing reactant can have a flow rate of about 125 sccm.

In step 805, the process chamber can be further stabilized with the oxidizing reactant flowing for a pre-selected time. In one embodiment, when the oxidizing reactant is nitrous oxide, the nitrous oxide can flow at 60 sccm for about four (4) minutes. Subsequently, a silicon containing reactant gas can be introduced into the process chamber as represented by step 806. In one embodiment, a silane reactant gas, such as dichloro-silane (DCS), can be used. In one embodiment, the silane reactant gas can be at a flow rate of about 13 sccm to about 90 sccm. In one embodiment, when the silane reactant gas is DCS, the DCS can have a flow rate of about 75 sccm, and when the oxidizing reactant is nitrous oxide, the nitrous oxide can have a flow rate of about 125 sccm. These flow rates can provide sufficient growth rates for depositing thicker oxides (for example, greater than about 0.01 microns) while maintaining thickness uniformity within complex trench features. In one embodiment, an oxide growth rate of about 0.001 microns per minute to about 0.002 microns per minute is used to form layer 134. In one embodiment, when more than one substrate is placed within the process chamber, the substrates can be spaced apart about 0.008 meters (about 0.3 inches). This increased distance compared to related processes was found to improve the uniformity of layer 134 across each substrate and between multiple substrates. Once the desired layer (for example, layer 134) is obtained, the process chamber can be purged and substrate 11 removed for further processing.

In step 806, layer 134 can be annealed, which can densify layer 134 and also increase the breakdown resistance of layer 134. In accordance with the present embodiment, layer 134 can be annealed at temperature from about 700 degrees Celsius to about 1125 degrees Celsius in a wet oxidation, a dry oxidation, or an inert (for example, nitrogen) environment. In one embodiment, layer 134 can be annealed at a temperature from about 1050 degrees Celsius to about 1100 degrees Celsius, first in nitrogen and followed by a dry oxygen oxidation for approximately eight (8) minutes before ramp-down. In one embodiment, layer 134 can be annealed first at a temperature of about 800 degrees Celsius to about 900 degrees Celsius in a wet oxidization environment before raising the temperature to 1050 degrees Celsius to about 1100 degrees Celsius. In one embodiment, nitrous oxide can be added. In a further embodiment, layer 134 can be annealed for about 10 to 20 minutes at 1100 degrees Celsius in nitrogen flowing at about 8-12 standard liters per minute and oxygen flowing at about 110 to 130 sccm. Subsequently, the oxygen can be turned off and layer 134 can be further annealed for about five (5) to ten (10) minutes in nitrogen. It was found that an anneal step can improve the quality of layer 134. For example, the anneal step can reduce the amount of nitrogen present in layer 134, and can increase its density, which can reduce the etch rate layer 134 compared to deposited oxides formed with related LPCVD processes, and can improve its breakdown voltage characteristics.

Figure 9:
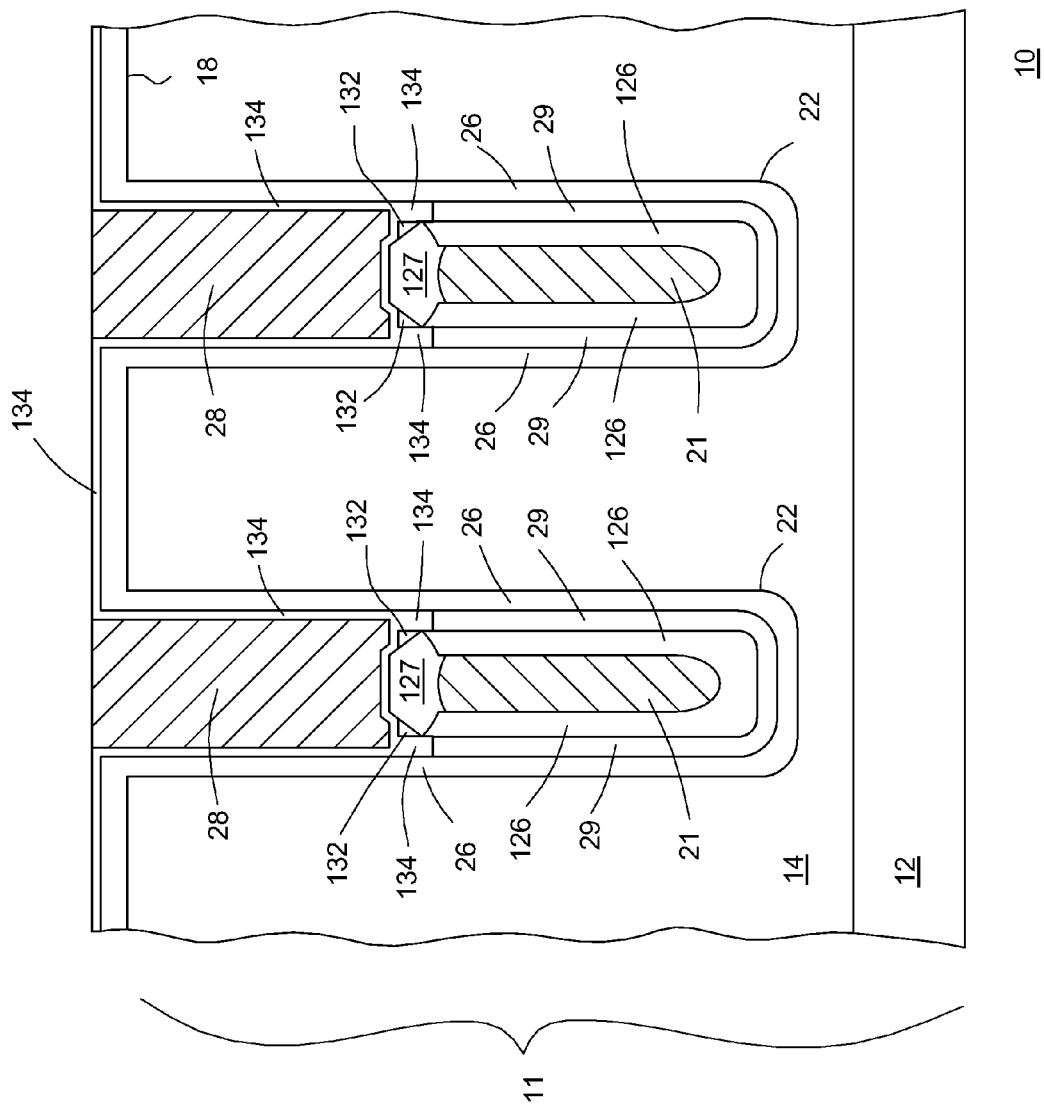
FIGS. 9-12 illustrate partial cross-sectional views of the semiconductor device of FIGS. 1-7 at further stages of fabrication in accordance with the present invention.

FIG. 9 illustrates a partial cross-sectional view of device 10 after additional processing. In one embodiment, a conductive layer or doped crystalline semiconductor layer can be formed overlying major surface 18 and within portions of trenches 22 adjacent to layer 134. In one embodiment, the conductive layer can comprise doped polysilicon. In one embodiment, the polysilicon can be doped with an n-type dopant, such as phosphorous or arsenic. Next, the conductive layer can be planarized. In one embodiment, the conductive layer can be planarized using CMP techniques. The planarized conductive layer forms gate electrodes 28 in trenches 22 as illustrated in FIG. 9. In one embodiment, when gate electrodes 28 are a doped crystalline semiconductor material, gate electrodes 28 can be annealed before or after planarization. In accordance with the present embodiment, layer 134 is configured as part of the gate dielectric structure for device 10. Additionally, layer 134 is configured to isolate recessed layer 29 from gate electrodes 28, which can reduce the amount of trapped charge in layer 29.

Figure 10:
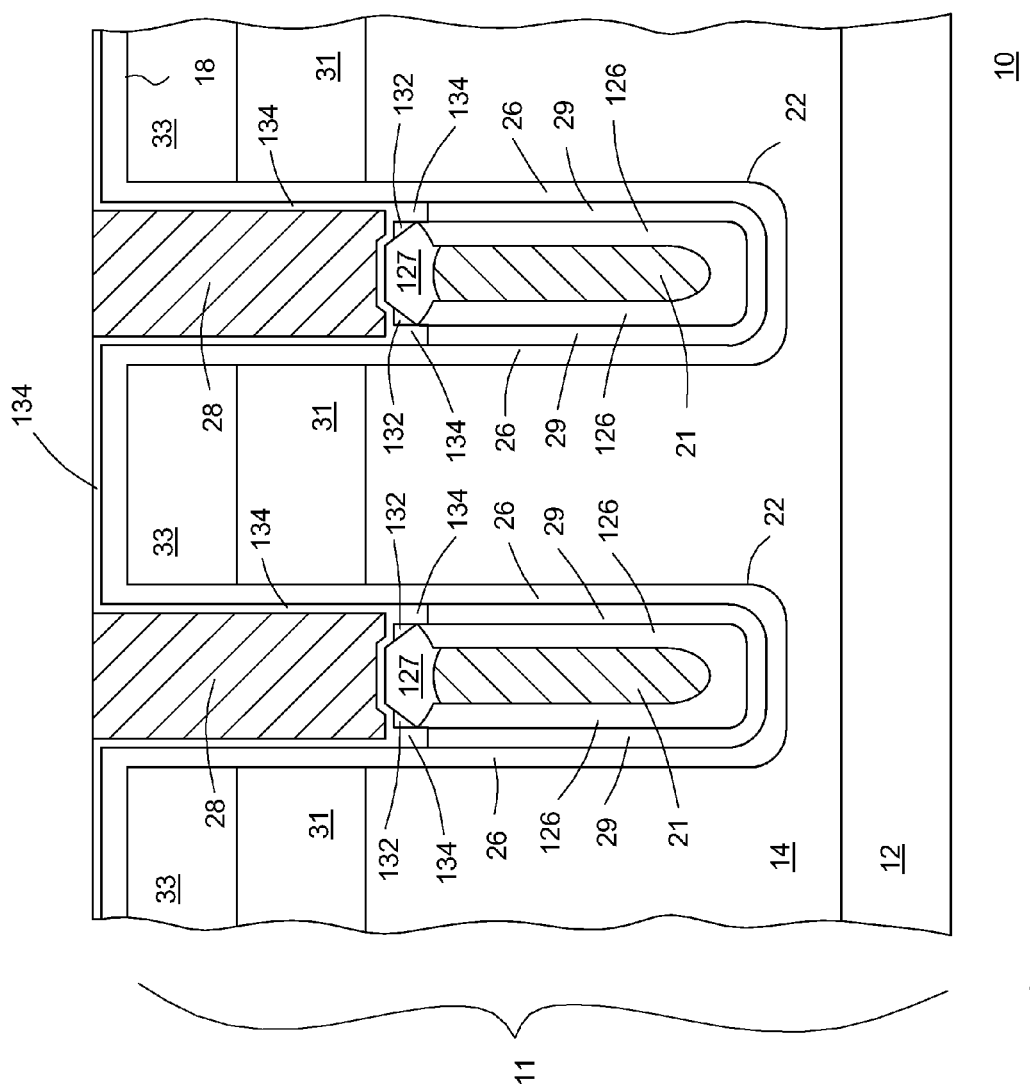

FIG. 10 illustrates a partial cross-sectional view of device 10 after further processing. Body, base, or doped regions 31 can be formed extending from major surface 18 adjacent trenches 22. Body regions 31 can have a conductivity type that is opposite to the conductivity type of semiconductor layer 14. In one embodiment, body regions 31 can have p-type conductivity, and can be formed using, for example, a boron dopant source. Body regions 31 have a dopant concentration suitable for forming inversion layers that operate as conduction channels or channel regions 45 (illustrated, for example, in FIG. 12) of device 10. Body regions 31 can extend from major surface 18 to a depth, for example, from about 0.5 microns to about 2.0 microns. It is understood that body regions 31 can be formed at an earlier stage of fabrication, for example, before trenches 22 are formed. Body regions 31 can be formed using doping techniques such as, ion implantation and anneal techniques.

Subsequently, an optional masking layer (not shown) can be formed overlying portions of major surface 18. In one embodiment, source regions, current conducting regions, or current carrying regions 33 can be formed within, in, or overlying body regions 31, and can extend from major surface 18 to a depth, for example, from about 0.1 microns to about 0.5 microns. In one embodiment, source regions 33 can have n-type conductivity, and can be formed using, for example, a phosphorous or arsenic dopant source. In one embodiment, an ion implant doping process can be used to form source regions 33 within body regions 31. The masking layer can then be removed, and the implanted dopant can be annealed.

Figure 11:
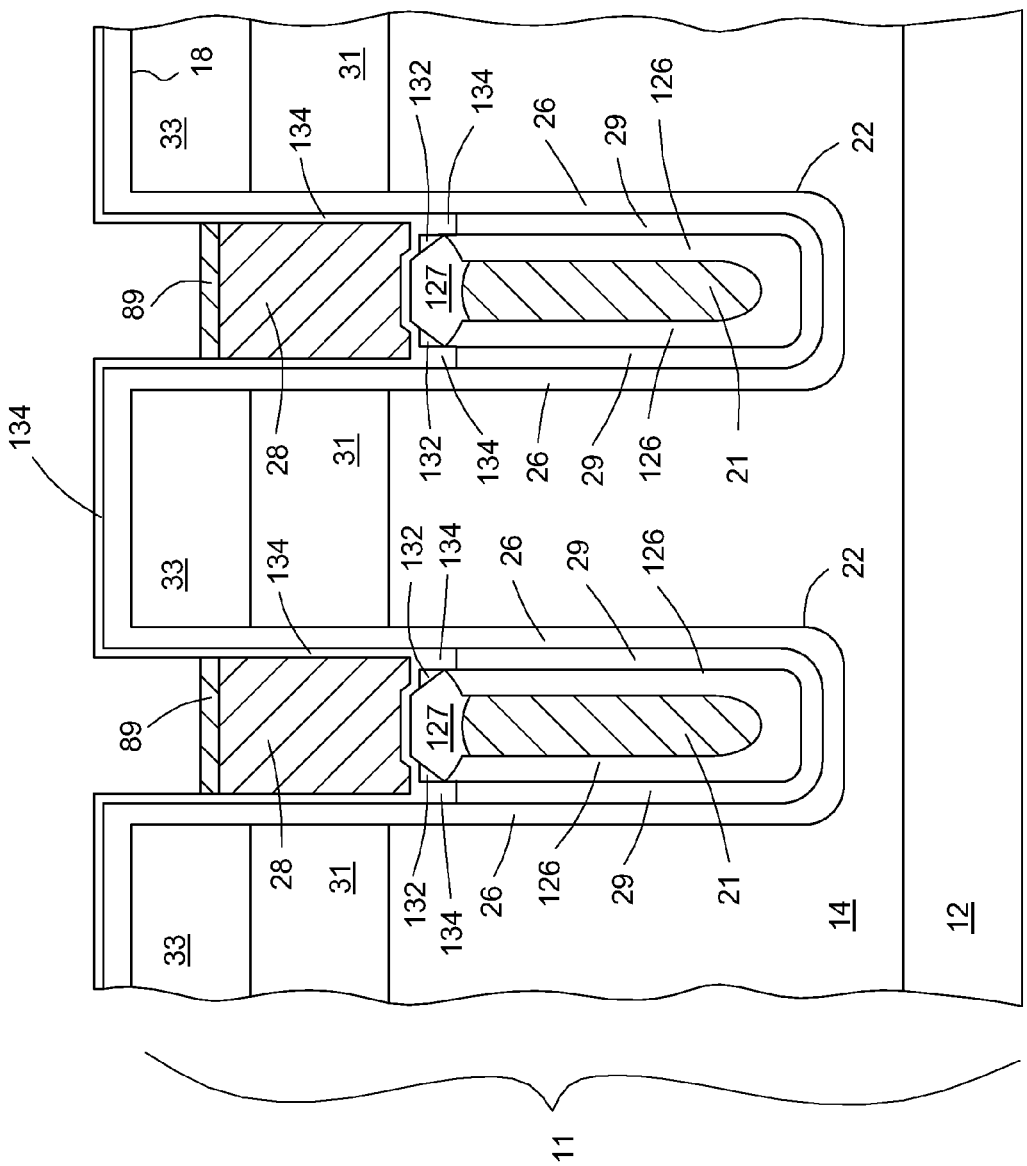

Gate electrodes 28 can be recessed below major surface 18 as illustrated in FIG. 11. In one embodiment, gate electrodes 28 can recessed below major surface 18 a distance from about 0.15 microns to about 0.25 microns. In an optional step, enhancement or conductive regions 89 can be formed within upper surfaces of gate electrodes 28. In one embodiment, conductive regions 89 can be self-aligned silicide structures. In one embodiment, conductive regions 89 can be cobalt silicide.

Figure 12:
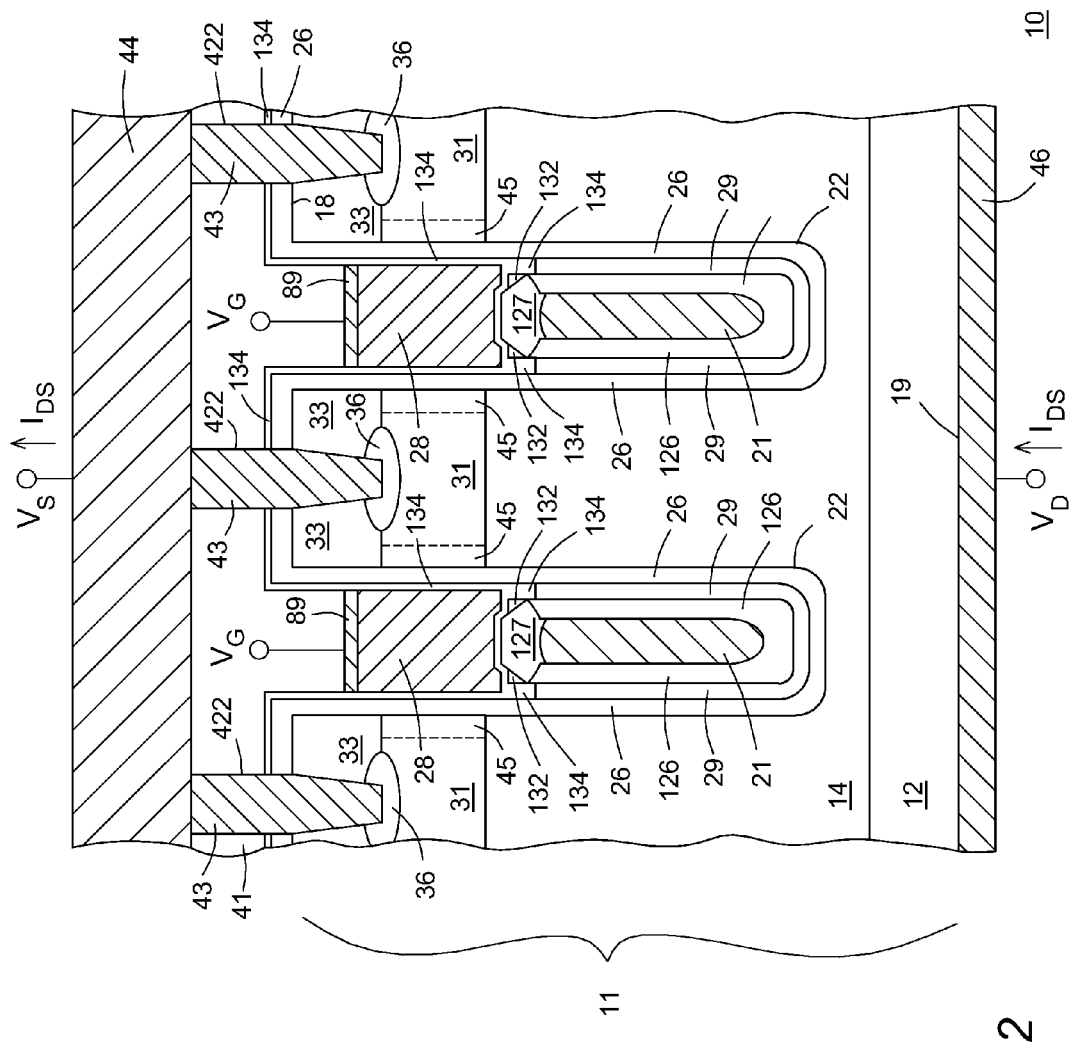

FIG. 12 illustrates a partial cross-section view of device 10 after additional processing. In one embodiment, a layer or layers 41 can be formed overlying major surface 18. In one embodiment, layers 41 comprise dielectric or insulative layers, and can be configured as an inter-layer dielectric (ILD) structure. In one embodiment, layers 41 can be silicon oxides, such as doped or undoped deposited silicon oxides. In one embodiment, layers 41 can include at least one layer of deposited silicon oxide doped with phosphorous or boron and phosphorous, and at least one layer of undoped oxide. In one embodiment, layers 41 can have a thickness from about 0.4 microns to about 1.0 microns. In one embodiment, layers 41 can be planarized to provide a more uniform surface topography, which improves manufacturability.

Subsequently, a masking layer (not shown) can be formed overlying device 10, and openings, vias, or contact trenches 422 can be formed for making contact to source regions 33 and body regions 31 as illustrated, for example, in FIG. 12. In one embodiment, the masking layer can be removed, and a recess etch can be used to remove portions of source regions 33 and portions of shield contact portion 142. The recess etch step can expose portions of body regions 31 below source regions 33. A p-type body contact, enhancement region, or contact region 36 can then be formed in body regions 31, which can be configured to provide a lower contact resistance to body regions 31. Ion implantation (for example, using boron) and anneal techniques can be used to form contact regions 36.

Conductive regions 43 can then be formed in contact trenches 422 and configured to provide for electrical contact to source regions 33 and body regions 31 through contact regions 36. In one embodiment, conductive regions 43 can be conductive plugs or plug structures. In one embodiment, conductive regions 43 can include a conductive barrier structure or liner and a conductive fill material. In one embodiment, the barrier structure can include a metal/metal-nitride configuration, such as titanium/titanium-nitride or other related or equivalent materials as known by one of ordinary skill in the art. In another embodiment, the barrier structure can further include a metal-silicide structure. In one embodiment, the conductive fill material includes tungsten. In one embodiment, conductive regions 43 can be planarized to provide a more uniform surface topography.

A conductive layer 44 can be formed overlying major surface 18, and a conductive layer 46 can be formed overlying another major surface 19 of substrate 11. Conductive layers 44 and 46 typically are configured to provide electrical connection between the individual device components of device 10 and a next level of assembly. In one embodiment, conductive layer 44 can be titanium/titanium-nitride/aluminum-copper or other related or equivalent materials as known by one of ordinary skill in the art, and is configured as a source electrode or terminal. In one embodiment, conductive layer 46 can be a solderable metal structure such as titanium-nickel-silver, chromium-nickel-gold, or other related or equivalent materials as known by one of ordinary skill in the art, and is configured as a drain electrode or terminal. In one embodiment, a further passivation layer (not shown) can be formed overlying conductive layer 44. In one embodiment, all or a portion of shield electrodes 21 can be connected to conductive layer 44 so that shield electrodes 21 are configured to be at the same potential as source regions 33 when device 10 is in use. In another embodiment, shield electrodes 21 can be configured to be independently biased or coupled in part to gate electrodes 28.

In one embodiment, the operation of device 10 can proceed as follows. Assume that source electrode (or input terminal) 44 and shield electrodes 21 are operating at a potential $V_S$ of zero volts, gate electrodes 28 would receive a control voltage $V_G$ of 4.5 volts, which is greater than the conduction threshold of device 10, and drain electrode (or output terminal) 46 would operate at a drain potential $V_D$ of less than 2.0 volts. The values of $V_G$ and $V_S$ would cause body region 31 to invert adjacent gate electrodes 28 to form channels 45, which would electrically connect source regions 33 to semiconductor layer 14. A device current $I_{DS}$ would flow from drain electrode 46 and would be routed through semiconductor layer 14, channels 45, and source regions 33 to source electrode 44. In one embodiment, $I_{DS}$ is on the order of 10.0 amperes. To switch device 10 to the off state, a control voltage $V_G$ that is less than the conduction threshold of device 10 would be applied to gate electrodes 28 (e.g., $V_G$<1.0 volts). Such a control voltage would remove channels 45 and $I_{DS}$ would no longer flow through device 10. In accordance with the present embodiment, gate layers 26 are formed before inter-electrode dielectric layers 127 are formed, which helps maintain the integrity of gate layers 26, and improves the thickness uniformity of gate layers 26 in trenches 22. Layer 134 is formed overlying gate layers 26 and inter-electrode dielectric layers 127, and is configured to improve the quality of gate layers 26, to improve the isolation between shield electrodes 21 and gate electrodes 28, and to improve the isolation between gate electrodes 28 and layer 29, which can improve the electrical performance and reliability of device 10 compared to related devices. Additionally, in one embodiment, layer 29 is recessed below upper surfaces of inter-electrode dielectric layers 127 to further isolate layer 29 from gate electrodes 28.

From all of the foregoing, one skilled in the art can determine that according to one embodiment, a method for forming a semiconductor device comprises the steps of providing a region of semiconductor material (for example, element 11) having a trench (for example, element 22) extending from a major surface (for example, element 18) and a first electrode (for example, element 21) formed within the trench. The method includes forming a first dielectric layer (for example, element 127) overlying the shield electrode using a first process and forming a second dielectric layer (for example, layer 13) overlying the first dielectric by reacting a mixture of a semiconductor containing reactant gas and an oxidizing reactant gas within a process chamber in a temperature range from 750 degrees Celsius to 850 degrees Celsius and in a pressure range from 350 milli-torr to 600 milli-torr. The method includes forming a second electrode (for example, element 28) adjacent the second dielectric layer within the trench.

Those skilled in the art will also appreciate that according to another embodiment, in the method described the step of forming the second dielectric layer includes forming the second dielectric layer where the second dielectric layer forms at least a portion of a gate dielectric structure.

Those skilled in the art will also appreciate that according to a further embodiment, in the method described the step of forming the second dielectric layer comprises reacting a mixture of a silane containing reactant gas and nitrous oxide.

Those skilled in the art will also appreciate that according to a further embodiment, the method described further comprises the step of annealing the second dielectric layer at a temperature from about 700 degrees Celsius to about 1125 degrees Celsius, and in one of a wet oxidation, a dry oxidation, or an inert environment.

Those skilled in the art will also appreciate that according to a still further embodiment, in the method described the step of providing the region of semiconductor material includes providing the region of semiconductor having a nitride layer (for example, element 29) formed between the first electrode and the region of semiconductor material, and wherein the method further comprises the steps of recessing the nitride layer before the step of forming the second dielectric layer to form a recessed portion, and forming the second dielectric layer within the recessed portion.

Those skilled in the art will also appreciate that according to another embodiment, a method for forming an insulated gate semiconductor device comprises the steps of providing a semiconductor substrate (for example element 11) have a first major surface (for example, element 18). The method includes forming a trench (for example, element 22) extending from the first major surface and forming a gate dielectric layer (for example, element 26) along surfaces of the trench. The method includes forming a shield electrode structure within the trench, wherein the shield electrode structure includes a shield electrode (for example, element 21) insulated from the semiconductor substrate by a dielectric structure (for example, elements 29, 261). The method includes forming an inter-electrode dielectric layer (for example, element 127) adjacent the shield electrode. The method includes forming a dielectric layer (for example, element 134) adjacent the gate dielectric layer and adjacent the inter-electrode dielectric layer, wherein the dielectric layer and gate dielectric form a gate dielectric structure. The method includes forming a gate electrode (for example, element 28) adjacent the dielectric layer.

Those skilled in the art will also appreciate that according to a further embodiment, in the method described the step of forming the shield electrode structure includes forming the shield electrode structure including a layer of nitride (for example, element 29), and wherein the step of forming the dielectric layer includes forming the dielectric layer configured to isolate the gate electrode from the nitride layer.

Those skilled in the art will also appreciate that according to yet another embodiment, a method for forming a semiconductor device comprising the steps of providing a semiconductor substrate (for example, element 11) with a trench feature (for example, element 22) and forming a dielectric layer (for example, element 134) within the trench feature by reacting a mixture of a semiconductor containing reactant gas and an oxidizing reactant gas within a process chamber in a temperature range from 750 degrees Celsius to 850 degrees Celsius and in a pressure range from 350 milli-torr to 600 milli-torr.

Those skilled in the art will also appreciate that according to a still further embodiment, a semiconductor device structure comprises a region of semiconductor material (for example, element 11) having a major surface (for example, element 18). A trench (for example, element 22) is formed in the region of semiconductor material extending from the major surface. A gate dielectric layer (for example, element 26) lines surfaces of the trench, and a dielectric structure (for example, elements 29, 261) is formed along lower portions of the gate dielectric layer. A first electrode (for example, element 21) is formed adjacent the dielectric structure. An inter-electrode dielectric layer (for example, element 127) is formed overlying the first electrode. A dielectric layer (for example, element 134) is formed along upper portions of the gate dielectric layer, upper surfaces of the dielectric structure, and an upper surface of the inter-electrode dielectric layer, wherein the dielectric layer and the gate dielectric layer form a gate dielectric structure. A second electrode (for example, element 28) is formed adjacent the dielectric layer.

Those skilled in the art will also appreciate that according to an additional embodiment, in the structure described the dielectric structure comprises a nitride layer (for example, element 29) formed adjacent lower portions of the gate dielectric layer, and an oxide layer (for example, element 261) formed adjacent the nitride layer.

Those skilled in the art will also appreciate that according to one more embodiment, in the structure described the nitride layer is recessed below an upper surface of the inter-electrode layer to form a recessed portion, and wherein the dielectric layer is formed within the recessed portion.

Those skilled in the art will also appreciate that according to a further embodiment, in the structure described the inter-electrode dielectric layer comprises a thermally grown oxide, and wherein the dielectric layer comprises a deposited oxide formed by reacting a mixture of a semiconductor containing reactant gas and an oxidizing reactant gas within a process chamber in a temperature range from 750 degrees Celsius to 850 degrees Celsius and in a pressure range from 350 milli-torr to 600 milli-torr.

Those skilled in the art will also appreciate that according to yet another embodiment, a method for forming a semiconductor device comprising the steps of providing a semiconductor substrate (for example, element 11) having a major surface (for example, element 18) and forming a dielectric layer (for example, element 134) in spaced relationship with the major surface by reacting a mixture of a semiconductor containing reactant gas and an oxidizing reactant gas within a process chamber in a temperature range from 750 degrees Celsius to 850 degrees Celsius and in a pressure range from 350 milli-torr to 600 milli-torr.

Those skilled in the art will also appreciate that according to a further embodiment, in the method described the step of reacting includes reacting a mixture of dichloro-silane and nitrous oxide with the process chamber.

Those skilled in the art will also appreciate that according to a still further embodiment, in the method described the step of reacting includes reacting the mixture of dichloro-silane and nitrous oxide, wherein the dichloro-silane has a flow rate of about 13 sccm to about 90 sccm and the nitrous oxide has a flow rate of about 40 sccm to about 140 sccm.

Those skilled in the art will also appreciate that according to an additional embodiment, in the method described the step of reacting includes reacting the mixture of dichloro-silane and nitrous oxide, wherein the dichloro-silane has a flow rate of about 70 sccm to about 80 sccm and the nitrous oxide has a flow rate of about 120 sccm to about 130 sccm.

In view of all the above, it is evident that a novel method and device is disclosed. Included, among other features, is forming a dielectric layer in trench structure using an improved LPCVD/HTO process. The method provides, among other things, a deposited dielectric layer having improved thickness uniformity particularly in small geometry (for example, less than 0.9 micron widths) trench features and having characteristics similar to thermally grown oxides. In one embodiment, the dielectric layer can be configured as part of a gate dielectric structure and/or as part of a dielectric layer that isolates a gate electrode from a nitride liner formed adjacent a shield electrode. The method improves the quality of deposited dielectric layers, which in turn improves the reliability and performance of semiconductor devices, such as insulated gate devices. The method integrates efficiently into power semiconductor device process flows.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, the subject matter has been described for a particular n-channel MOSFET structure, although the method and structure is directly applicable to other MOS transistors, as wells as bipolar, BiCMOS, metal semiconductor FETs (MESFETs), HFETs, thyristors bi-directional transistors, and other transistor structures. Also, the structures illustrated and described herein can be scaled to provide devices having higher or lower $BV_{DSS}$ characteristics. Additionally, although silicon containing reactant gases have been described herein, other semiconductor material containing reactants can be used that react with an oxidizing reactant to form a conformal dielectric layer.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention, and form different embodiments, as would be understood by those skilled in the art.

We claim:

1. A method for forming a semiconductor device comprising the steps of:
   providing a region of semiconductor material having a trench extending from a major surface and a first electrode formed within the trench;
   forming a first dielectric layer overlying the first electrode;
   stabilizing the region of semiconductor material in a process chamber having a temperature in a range from about 750 degrees Celsius to about 850 degrees Celsius and a pressure in a range from about 350 milli-torr to about 600 milli-torr;
   pre-heating an oxidizing reactant gas before the oxidizing reactant gas enters the process chamber;
   introducing the oxidizing reactant gas into the process chamber;
   thereafter introducing a semiconductor containing reactant gas into the process chamber to form a second dielectric layer overlying the first dielectric layer; and
   forming a second electrode adjacent the second dielectric layer within the trench.

2. The method of claim 1, wherein the step of introducing the semiconductor containing reactant gas into the process chamber includes introducing the semiconductor containing reactant gas into the process chamber to form the second dielectric layer where the second dielectric layer forms at least a portion of a gate dielectric structure.

3. The method of claim 1, wherein the step of introducing the oxidizing reactant gas includes introducing nitrous oxide, and wherein the step of introducing the semiconductor containing reactant gas includes introducing a silane containing reactant gas.

4. The method of claim 3, wherein the step of introducing the silane containing reactant gas includes introducing dichloro-silane.

5. The method of claim 1 further comprising the step of annealing the second dielectric layer at a temperature from about 700 degrees Celsius to about 1125 degrees Celsius, and in one of a wet oxidation, a dry oxidation, or an inert environment.

6. The method of claim 1, further comprising the step of annealing the second dielectric layer at a temperature of about 1100 degrees Celsius in nitrogen and oxygen.

7. The method of claim 1, wherein the step of providing the region of semiconductor material includes providing the region of semiconductor having a nitride layer formed between the first electrode and the region of semiconductor material, and wherein the method further comprises the steps of:
   recessing the nitride layer before the step of forming the second dielectric layer to form a recessed portion; and
   forming the second dielectric layer within the recessed portion.

8. A method for forming an insulated gate semiconductor device comprising the steps of:
   providing a semiconductor substrate have a first major surface;
   forming a trench extending from the first major surface;
   forming a gate dielectric layer along surfaces of the trench;
   forming a shield electrode structure within the trench, wherein the shield electrode structure includes a shield electrode insulated from the semiconductor substrate by a dielectric structure;
   forming an inter-electrode dielectric layer adjacent the shield electrode;
   stabilizing the semiconductor substrate in a process chamber having a temperature in a range from 750 degrees Celsius to 850 degrees Celsius and a pressure in a range from 350 milli-torr to 600 milli-torr;
   pre-heating nitrous oxide before the nitrous oxide enters the process chamber;
   introducing nitrous oxide into the process chamber;
   thereafter introducing dichloro-silane into the process chamber to form a dielectric layer adjacent the gate dielectric layer and adjacent the inter-electrode dielectric layer wherein the dielectric layer and gate dielectric form a gate dielectric structure; and
   forming a gate electrode adjacent the dielectric layer.

9. The method of claim 8, wherein the step of forming the shield electrode structure includes forming the shield electrode structure including a layer of nitride, and wherein the step of forming the dielectric layer includes forming the dielectric layer configured to isolate the gate electrode from the nitride layer.

10. The method of claim 9 further comprising the step of recessing the first nitride layer below an upper surface of the inter-electrode dielectric layer to form a recessed portion, wherein the step of forming the dielectric layer comprises forming the dielectric layer within the recessed portion.

11. The method of claim 8 further comprising the step of stabilizing the process chamber with the nitrous oxide flowing for a pre-selected time before introducing the dichloro-silane.

12. The method of claim 8, wherein stabilizing the semiconductor substrate in the process chamber comprises stabilizing the semiconductor substrate where the process chamber has a temperature profile with a higher temperature established proximate to a source gas inlet to the process chamber and a lower temperature is established away from the source gas inlet.

13. The method of claim 8, further comprising the step of annealing the dielectric layer in one of a wet oxidation, a dry oxidation, or an inert ambient.

14. The method of claim 8 further comprising the step of forming dielectric regions adjacent the inter-electrode dielectric layer before the step of forming the dielectric layer.

15. A method for forming a semiconductor device comprising the steps of:
   providing a semiconductor substrate with a trench feature;
   stabilizing the semiconductor substrate in a process chamber having a temperature in a range from about 750 degrees Celsius to about 850 degrees Celsius and a pressure in a range from about 350 milli-torr to about 600 milli-torr;
   pre-heating an oxidizing reactant gas before the oxidizing reactant gas enters the process chamber;
   introducing the oxidizing reactant gas into the process chamber; and
   thereafter introducing a semiconductor containing reactant gas into the process chamber to form a conformal dielectric layer having generally uniform thickness within the trench feature.

16. The method of claim 15, wherein pre-heating the oxidizing reactant gas comprises pre-heating nitrous oxide reactant gas, and wherein introducing the semiconductor containing reactant gas comprises introducing dichloro-silane.

17. The method of claim 15, wherein introducing the semiconductor containing reactant gas comprises introducing the semiconductor containing reactant gas to form the dielectric layer as part of a gate dielectric structure.

18. The method of claim 15, wherein introducing the semiconductor containing reactant gas comprises introducing the semiconductor containing reactant gas to form the dielectric layer over a shield electrode, the method further comprising forming a gate electrode adjoining the dielectric layer.

19. The method of claim 15 further comprising the step of annealing the dielectric layer in one of a wet oxidation, a dry oxidation, and an inert environment.

20. The method of claim 15, wherein the trench feature has a width less than 0.9 microns.

* * * * *